United States Patent [19]

Stutius et al.

[11] Patent Number: 5,311,533
[45] Date of Patent: May 10, 1994

[54] INDEX-GUIDED LASER ARRAY WITH SELECT CURRENT PATHS DEFINED BY MIGRATION-ENHANCED DOPANT INCORPORATION AND DOPANT DIFFUSION

[75] Inventors: Wolfgang E. Stutius, Weston; Tien Y. Wang, Lexington, both of Mass.

[73] Assignee: Polaroid Corporation, Cambridge, Mass.

[21] Appl. No.: 965,852

[22] Filed: Oct. 23, 1992

[51] Int. Cl.$^5$ ............................................. H01S 3/19
[52] U.S. Cl. .................................... 372/46; 372/45
[58] Field of Search ............................ 372/43-50

[56] References Cited

U.S. PATENT DOCUMENTS

| | | | |
|---|---|---|---|
| 4,653,057 | 3/1987 | van Oirschot | 372/46 |
| 4,682,337 | 7/1987 | Amann | 372/44 |
| 4,727,557 | 2/1988 | Burnham et al. | 372/50 |
| 4,791,651 | 12/1988 | Taneya et al. | 372/50 |
| 4,803,691 | 2/1989 | Scifres et al. | 372/150 |
| 4,819,243 | 4/1989 | Opschoor | 372/45 |
| 4,897,846 | 1/1990 | Yoshida et al. | 372/46 |
| 4,903,274 | 2/1990 | Taneya et al. | 372/48 |
| 4,932,033 | 6/1990 | Miyazawa et al. | 372/46 |
| 5,048,038 | 9/1991 | Brennan et al. | 372/46 |
| 5,065,200 | 11/1991 | Bhat et al. | 357/4 |
| 5,065,404 | 11/1991 | Okajima et al. | 372/46 |
| 5,070,509 | 12/1991 | Meyers | 372/45 |
| 5,138,625 | 8/1992 | Paoli et al. | 372/46 |

OTHER PUBLICATIONS

"High-Power Fundamental Mode AlGaAs Quantum Well . . . Molecular Beam Epitaxy", by Jaeckel et al., Appl. Phys. Lett., 55, 1059 (1989, Sep.).
"Orientation-Dependent Doping in Organometallic Chemical Vapor Deposition . . . Lateral p-n Junction Arrays", by R. Bhat et al., Appl. Phys. Lett., 56, 1691 (1990, Apr.).
"Very Dense 102-Laser . . . Threshold Current", by S. Hirata et al., Appl. Phys. Lett., 58, 319, 1991 (Jan.).
"Orientation Dependence of . . . Grown on Non-Planar Substrates", by R. Bhat et al., Journal of Crystal Growth, 107, 772-778 (1991).
"A Submilliampere-Threshold Multiquantum . . . Using Single-Step MOCVD", by Narui et al., IEEE J. Quantum Electronics, 28, 4-8 (1992).

Primary Examiner—John D. Lee
Attorney, Agent, or Firm—Edward S. Roman; Joseph Stecewycz

[57] ABSTRACT

A method is provided for producing a novel index-guided laser or laser array by MOCVD in a single growth step. A ridge or a number of ridges are first fabricated by dry or wet etching on a GaAs wafer; and n-and p-type epitaxial layers including cladding layers and an active layer are then grown on the entire wafer surface, forming the laser structure. One or more current blocking layers are incorporated into an upper cladding layer which is grown after the active layer. Due to migration-enhanced dopant incorporation and dopant diffusion during the growth, the current blocking layer is rendered ineffective in the vicinity of the ridges, thus forming a laterally restricted current path for carrier injection. The laser is index-guided on the ridges. This laser structure is extremely simple to produce since it requires no further photolithographic masking steps after growth, only metallization.

22 Claims, 7 Drawing Sheets

INDEX-GUIDED LASER ARRAY WITH SELECT CURRENT PATHS DEFINED BY MIGRATION-ENHANCED DOPANT INCORPORATION AND DOPANT DIFFUSION

BACKGROUND OF THE INVENTION

Lateral definitions or restrictions are required to confine current and light in high performance optoelectronic devices. Processing techniques such as etching, proton implantation, regrowth, diffusion induced disordering have been developed to distribute the optical power over an array of lasing elements, leading to improved near field uniformity and increased limits on power. These approaches, however, require complex processing steps and stringent control over the epitaxial process and wafer handling.

A single-step growth process is thus highly desirable for the fabrication of index-guided lasers and laser arrays. Such devices have recently been fabricated on patterned GaAs substrates using molecular beam epitaxy (MBE) via orientation-dependent amphoteric doping of Si in AlGaAs, as disclosed by Jaeckel et al. appearing in Appl. Phys. Lett. 55, 1059 (1989), and on patterned InP substrates using metal organic chemical vapor deposition (MOCVD) via orientation-dependent dopant incorporation, as disclosed by Bhat et al. appearing in Appl. Phys. Lett. 56, 1691 (1990).

Another approach is through insertion of a current blocking layer adjacent to the quantum-well, as disclosed by Hirata et al. appearing in Appl. Phys. Lett. 58, 319 (1991).

These implementations require either a very tight control of the growth sequence or offer only limited options for the width of the waveguide.

Geometry dependent doping in crystal growth by MOCVD has been described by Bhat and Zah in U.S. Pat. No. 5,065,200 (December 1989) and in the technical paper by Bhat et al. entitled "Orientation dependence of S,Zn, . . . doping. . . : , J. Cryst. Growth 107, 772–778 (1991). The devices discussed in these publications still require selective contacting of the top layer after growth where the contact area has to line up with the ridge(s).

A laser structure reported by Narui et al. in IEEE J. Quantum Electronics 28, 4–8 (1992), entitled "A Sub-milliampere-Threshold Multiquantum-Well AlGaAs Laser Without Facet Coating Using Single-Step MOCVD", has the advantage of not requiring an additional photolithographic step after growth. However, this process requires careful positioning of the n-type current blocking layer in the p-cladding layer with respect to the position of the active layer. Moreover, the process requires epitaxial growth over etched substrates with high aspect-ratio, which not only demands tight control over the growth process, but also strictly limits the effective window openings for current injection on the ridges.

SUMMARY OF THE INVENTION

Accordingly, an object of the invention is to provide electronic devices for which the number of mask levels used in fabrication is reduced.

It is another object of this invention to provide such electronic devices in which lateral interfaces can be formed without the use of photolithography after the growth is completed.

It is an even further object of this invention to provide a simplified double heterostructure or quantum-well laser structure with lateral current blocking layers by a single-step MOCVD process.

Index-guided separate confinement lasers with lateral PNP current blocking layers are provided by a single-step MOCVD process on a patterned GaAs substrate. The substrate is patterned by forming raised ridge regions using photolithography with subsequent wet etching and/or reactive ion etching. Current-blocking layers of the opposite conductivity type are inserted in a cladding layer. The current-blocking layers do not have to be directly adjacent to the active layer on top of the ridge. Dopant atoms diffuse on top of the ridges and convert the conductivity type of the current-blocking layers to that of the upper cladding layer depending upon the specific ridge geometry, relevant doping levels and layer thicknesses. The final distribution of dopant atoms is governed by the presence of structured surfaces during the growth. The incorporation of dopants is enhanced by the migration of dopant atoms on the structured surfaces and in the gas phase. This leads to an enhanced dopant diffusion in the vicinity of the ridges, leaving the current-blocking layers over the rest of the structure intact. Current is, therefore, channeled to the top of the ridges, forming an index-guided laser structure with lateral current confinement.

DESCRIPTION OF THE DRAWINGS

The novel features that are considered characteristic of the invention are set forth with particularity in the appended claims. The invention itself, however, both as to its organization and its method of operation together with other objects and advantages thereof will be best understood from the following description of the illustrated embodiment when read in connection with the accompanying drawings wherein:

DESCRIPTION OF THE INVENTION

Figure 1:
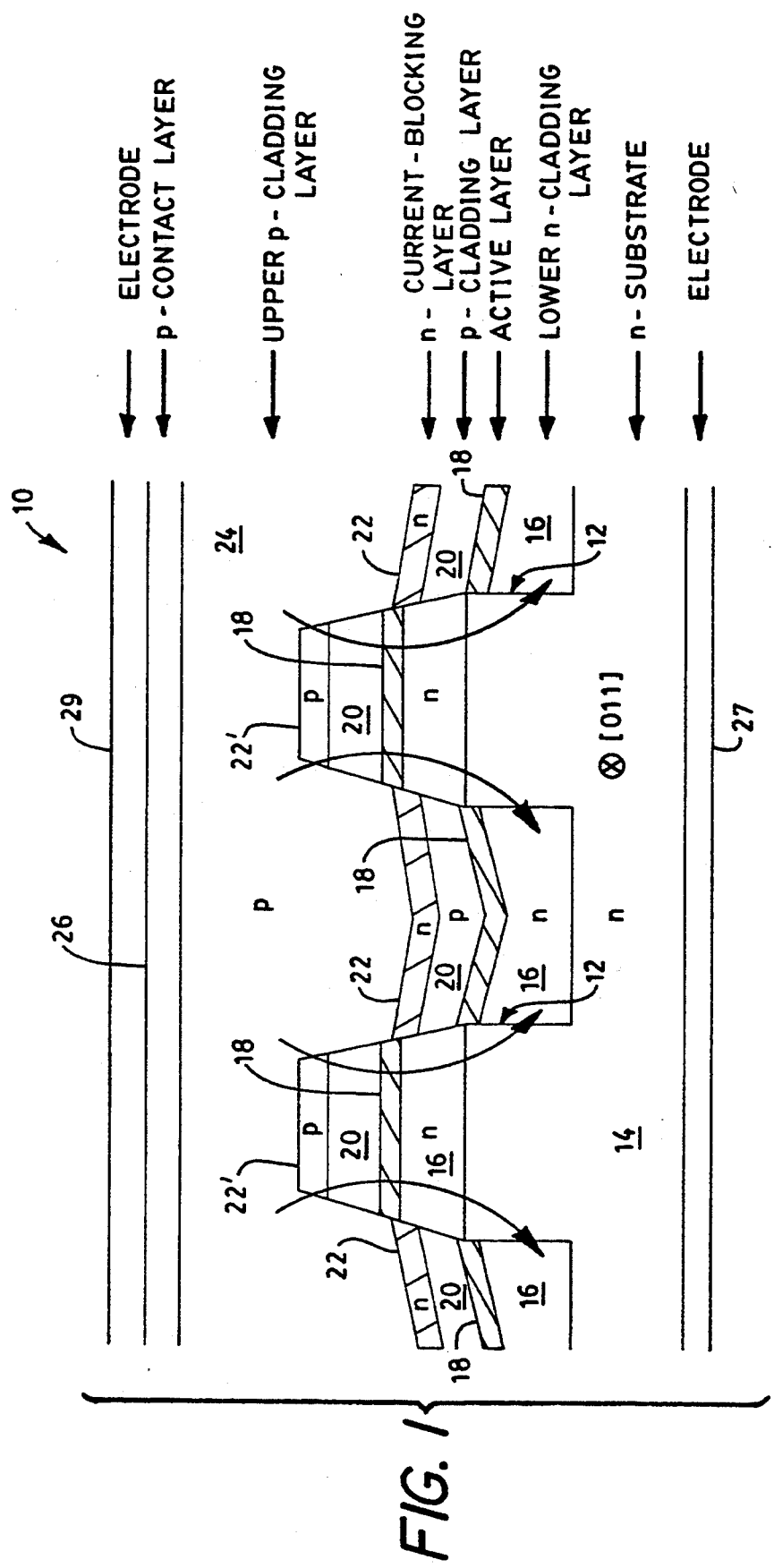
FIG. 1 is a cross-sectional view of a laser array according to the invention utilizing a single blocking layer in the upper cladding layer.

A first embodiment of the invention is illustrated at 10 in cross section in FIG. 1. A plurality of raised ridges 12 are formed on an n-type GaAs substrate 14 by wet- or dry-etching. Subsequently, a lower n-type cladding layer 16 and an active layer 18 are grown on top of the ridges and on the flat part of the substrate 14. A p-type upper cladding layer portion 20, an n-type current blocking layer 22, a second p-type upper cladding layer portion 24, and a p-type GaAs contact layer 26 are thereafter grown in sequence. Metallized electrodes 27 and 29 are provided on the underside and top of the structure, respectively, for electrical contacts.

The (111) B crystal planes associated with the ridges 12 are so-called no-growth planes. Thus, either the growth on top of each ridge 12 will proceed up and converge at a select point or apex above the ridge where it will stop until the growth on the flat part of the substrate catches up, or the growth on the sidewalls will catch up with the growth on the ridges before it reaches the select point. Further growth on the structure tends to planarize; and, therefore, in either case the epitaxial growth will eventually become planar. The structure is terminated with the contact layer 26, and the entire laser structure is grown without interruption.

Except for preprocessing of the wafer substrate 14 to define the locations and dimensions of the ridges 12 by photolithography and etching, no critical and time-consuming processing steps are required after growth. The completion of the device processing requires only broad area metallization for p- and n- contacts. The index guiding is achieved by having the upper p-type cladding layer 20 with its lower index of refraction adjacent to the active layer 18, and the current laterally confined via the current blocking layer 22. The portions 22' of the current-blocking layer 22 growing on top of the ridges 12 convert into p-type via interdiffusion of the p-dopant from the upper cladding layer portions 20 and 24 during growth, thus allowing an unimpeded flow of the current as will be subsequently described in greater detail herein. For efficient current blocking, the current blocking layer 22 between the ridges 12 is preferably located below the active layer 18 on the ridges 12 in order to take advantage of the difference in bandgap between the active layer 18 and the junction between the cladding layers 16 and 20 on the sidewalls of each ridge. As will be well understood, waveguide layers (not shown) may be interposed between the cladding layers 16, 20 and the active layer 18.

The above-described embodiment was reduced to practice utilizing $Al_xGa_{1-x}As$ waveguide and cladding layers and an InAlGaAs active layer grown in a low pressure (50 Torr) MOCVD reactor using trimethyl aluminum (TMAl), trimethyl gallium (TMGa), ethyldimethyl indium (EDMIn), and arsine on (100) GaAs substrates. Bis(cyclopentadienyl) magnesium ($Cp_2Mg$) and hydrogen selenide ($H_2Se$, 200 ppm in $H_2$) were used as the p- and n-type dopants, respectively. It will be understood that other suitable p-type dopants include Be, Zn or Cd. Other suitable n-type dopants include S, Te or Si. Before epitaxy, 5 $\mu$m stripes on 9 $\mu$m centers were defined on the substrate 14 along [011] directions. For this stripe width, the ridge depth was kept below 1.5 $\mu$m so that the epitaxial growth on the side walls caught up with that on top of the ridges 12 well before the growth on top of the ridges would have otherwise converged and terminated. The growth of the waveguide layer on top of the ridges 12 and in the grooves between the ridges 12 is therefore discontinuous, forming the desired lateral index-steps.

The following patterning sequence was utilized for fabricating the nonplanar, etched GaAs substrate 14. Stripes were defined on the (100) GaAs substrate 14 using $Si_3N_4$ as the mask for etching. The patterning sequence is described as follows: First, a layer of $Si_3N_4$(1000 Å thick) was deposited on the GaAs substrate 14. Then the substrate 14 was spin-coated with a photoresist layer on which stripes were defined using conventional photolithographic etching. In the next step, the stripes were transferred into the $Si_3N_4$ layer by plasma etching in $CF_4$. The resist mask was then stripped using acetone and an oxygen plasma. This was followed by an etching step, and the stripes were transferred into the GaAs substrates 14 through the $Si_3N_4$ mask. In the final step, the residual $Si_3N_4$ mask was removed using plasma etching in $CF_4$. The desired depth between ridges 12 can be obtained by either wet etching in $H_2SO_4:H_2O_2:H_2O$(8:1:1 by volume) at room temperature, or by reactive ion etching (RIE) in $SiCl_4$ at 10 mTorr and 40° C.

The MOCVD growth sequence occurred as follows: Before the growth, the patterned GaAs substrate 14 was thoroughly solvent-cleaned in tetrachloroethane, acetone, methanol and iso-propyl alcohol. The substrate 14 was then briefly etched by dipping in $H_2SO_4:H_2O_2:H_2O$(10:1:1 by volume) and in concentrated hydrochloric acid at room temperature. Arsine was introduced into the growth chamber as the substrate temperature reached 380° C. The temperature was then raised to 820° C. and the substrate baked for 5 minutes. The epitaxial growth started with an n-type GaAs:Se buffer layer (n=$5 \times 10^{17}$ to $10^{18}$ cm$^{-3}$, 0.1 $\mu$m), followed by an n-type $Al_{0.5}Ga_{0.5}As$:Se cladding layer 16 (n=$7 \times 10^{17}$ to $10^{18}$ cm$^{-3}$,1 $\mu$m). The substrate temperature was then lowered to 700° C. to grow the AlGaInAs active layer 18 (unintentionally doped, 70 Å) which was sandwiched between $Al_{0.33}Ga_{0.67}As$ barrier layers (unintentionally doped, 125 Å each). The substrate temperature was then raised again to 820° C. to grow the $Al_{0.5}Ga_{0.5}As$:Mg p-cladding layer portion 20 (p=$7 \times 10^{17}$ to $10^{18}$ cm$^{-3}$, 0.6 $\mu$m). An $Al_{0.5}Ga_{0.5}As$:Se current-blocking layer 22 (n=$10^{17}$ to $5 \times 10^{17}$ cm$^{-3}$,0.3 $\mu$m) was grown on the p-cladding layer portion 20 at a position of 0.6 $\mu$m above the active layer 18, and the remaining 1.4 $\mu$m thick portion of the p-cladding layer as shown at 24 was thereafter grown. The substrate temperature was then lowered to 720° C. to complete the growth with a p-type GaAs:Zn contact layer 26 (p=$3 \times 10^{19}$ cm$^{-3}$,0.2 $\mu$m).

The Se-doped, n-type AlGaAs current-blocking layer 22 was grown simultaneously on top of the ridges 12 and the grooves between the ridges 12. Because of the observed migration-enhanced dopant diffusion, Mg atoms migrated from the p-cladding layers 20 and 24 into the n-type current-blocking layers 22' on top of the ridges 12 and punched through. At the same time, but to a much lesser extent, Se atoms migrated into the adjacent p-cladding layers 20 and 24; however, the npnp current-blocking structure between the ridges 12 was preserved. Most importantly, however, although Mg diffusion through the n-blocking layer at portions 22' was observed on top of the ridges 12, very little, if any, Mg diffused into the n-blocking layer 22 over the rest of the structure. Therefore, the only further processing steps required for finishing the device were p- and n-metallization.

Figure 2:
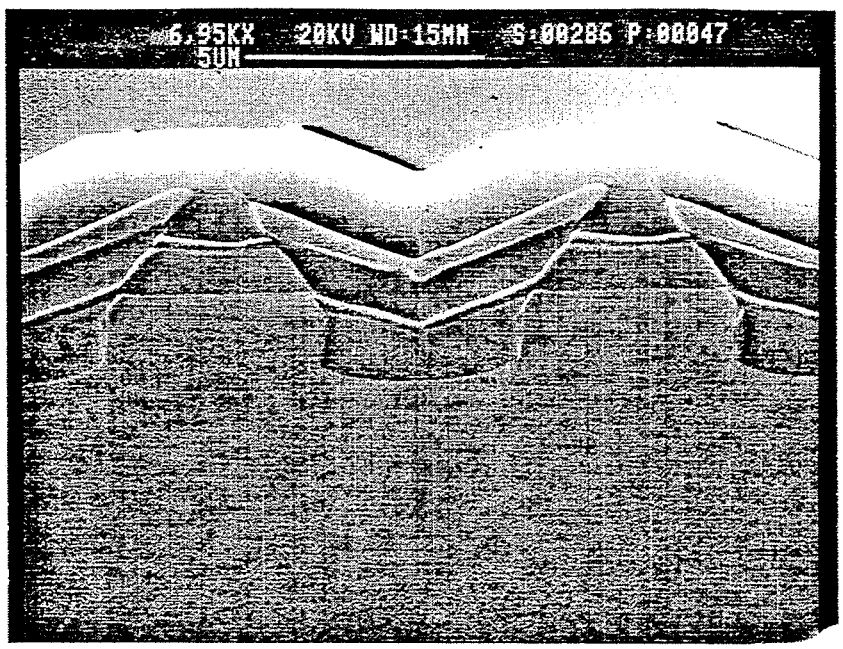
FIG. 2 is a scanning electron microscope (SEM) micrograph of a cross section of an experimental laser similar to the structure shown in FIG. 1.
Figure 3:
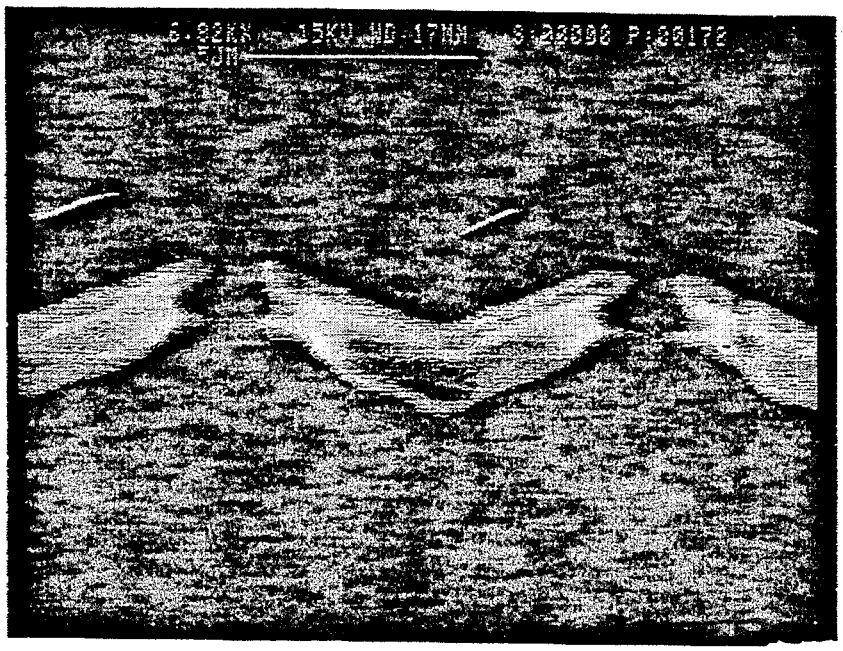
FIG. 3 is an electron-beam induced current (EBIC) micrograph taken with a SEM of the device shown in FIG. 2, demonstrating efficient current blocking.

FIG. 2 shows a scanning electron microscope (SEM) micrograph cross-section of the laser structure of this invention after being stained with KOH:KFe(CN)$_6$:-H$_2$O solution to delineate the p- and n-type layers. It is clearly observed that Mg atoms punched through the n-type current-blocking layer portions 22' on the ridges 12, while the npnp structures were preserved in the grooves between the ridges 12. The lateral pn junction formation was further evidenced by measuring the electron beam induced junction current (EBIC) from the uncoated front facet of the bonded diodes within the laser array. FIG. 3 shows and SEM micrograph of the uncoated laser diodes where the position of each pn junction is revealed as a bright stripe. Only one junction is identified near the waveguide region on the top of each ridge 12, while multiple junctions prevail in the grooves between the ridges. Thus, effective lateral current confinement was achieved in a single-step MOCVD process to fabricate an index-guided laser array in accordance with this invention. For instance, a 13-stripe laser array of the structure in FIG. 1 was fabricated simply by lapping and blanket metallization.

Figure 4:
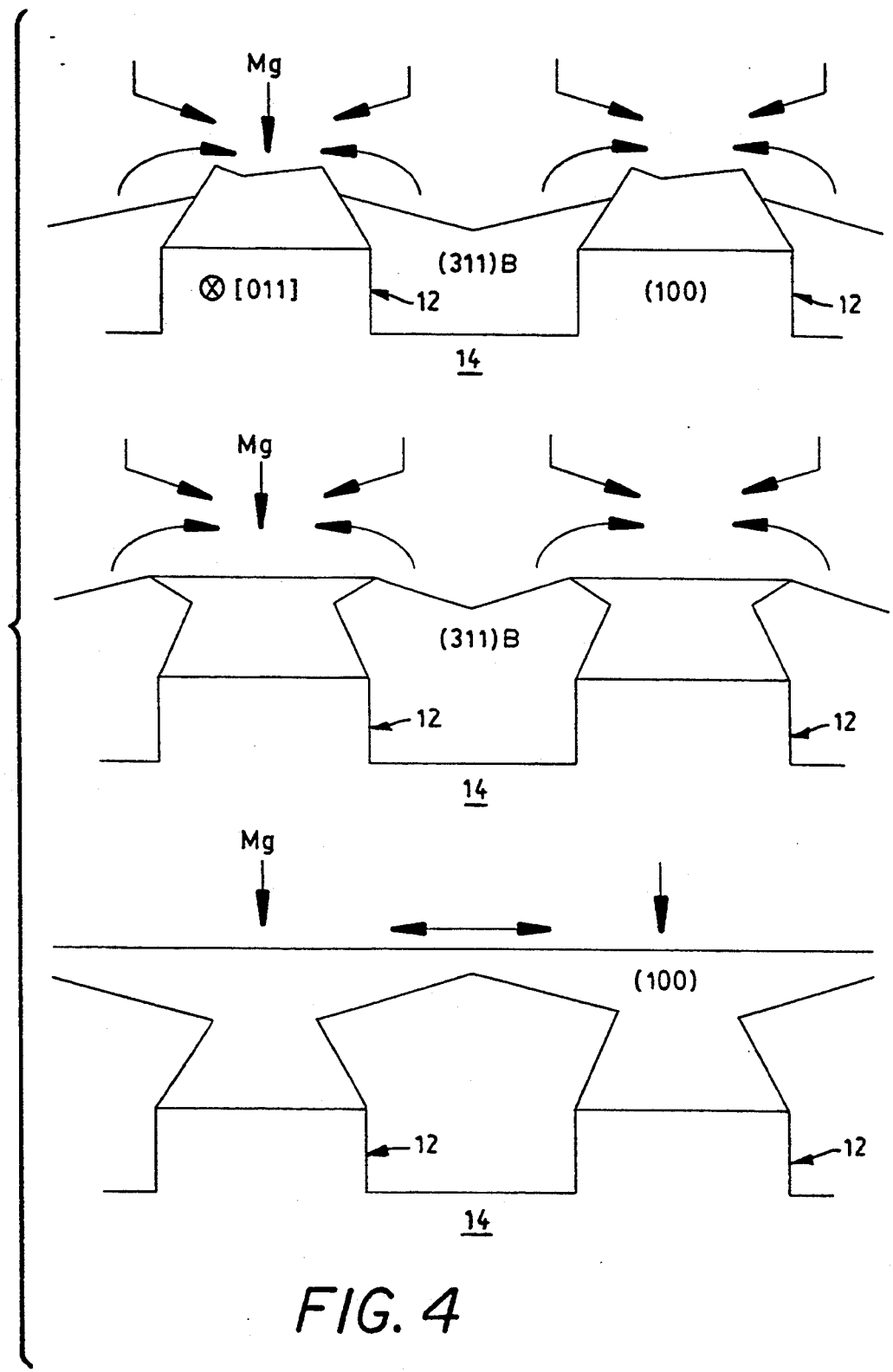
FIG. 4 is a series of schematic diagrams showing the progressive distribution of the dopant atoms on the structured growing surfaces of the laser array of FIG. 1.
Figure 5:
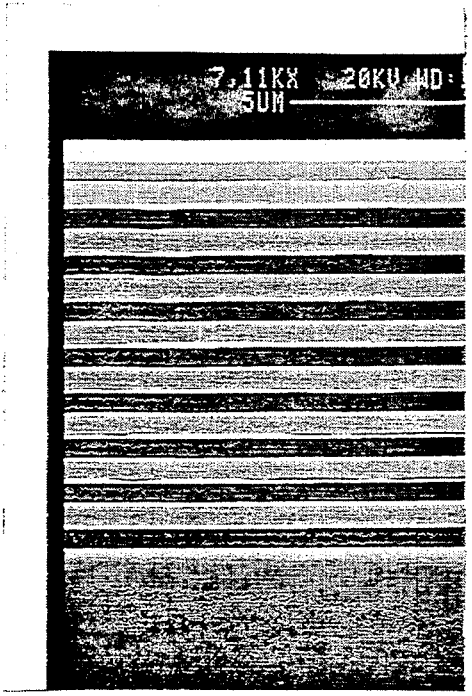
FIG. 5 is a micrograph of an SEM cross-section of test structure on (100) flat substrate after stain-etching. The structure contains AlGaAs layers alternately doped with Mg and Se.

The presence of the above-described distinct doping regions is attributed to the extra supply of dopant atoms from neighboring facets during the growth, as shown in FIGS. 4A-4C. This effect is believed to occur because the preferential sites for the group II dopants are the same as those for the group III atoms, i.e., (100) and the preferential sites for the group VI dopants are the same as those for the group V atoms, i.e., (n11)B. The dopant atoms therefore migrate on the growing surface, with Mg atoms being preferentially incorporated into the ridge tops and Se atoms being preferentially incorporated into the (n11)B sidewalls. A concentration gradient is thus established on the growing surface and in the gas phase which drives more Mg atoms to the ridge tops and Se atoms along to the sidewalls. This leads to an enhanced incorporation and subsequent diffusion of Mg atoms for layers growing on the ridges and Se atoms for layers growing on (n11)B side walls.

For the planarized layers above the ridges 14, the conductivity type of the individual layers remains intact, unlike the observed conductivity type changes for layers of the same orientation grown before total planarization. This is attributed to the diminishing (n11)B facets and lack of excess supply of the pertinent dopant atoms which render the interdiffusion process ineffective.

Figure 6:
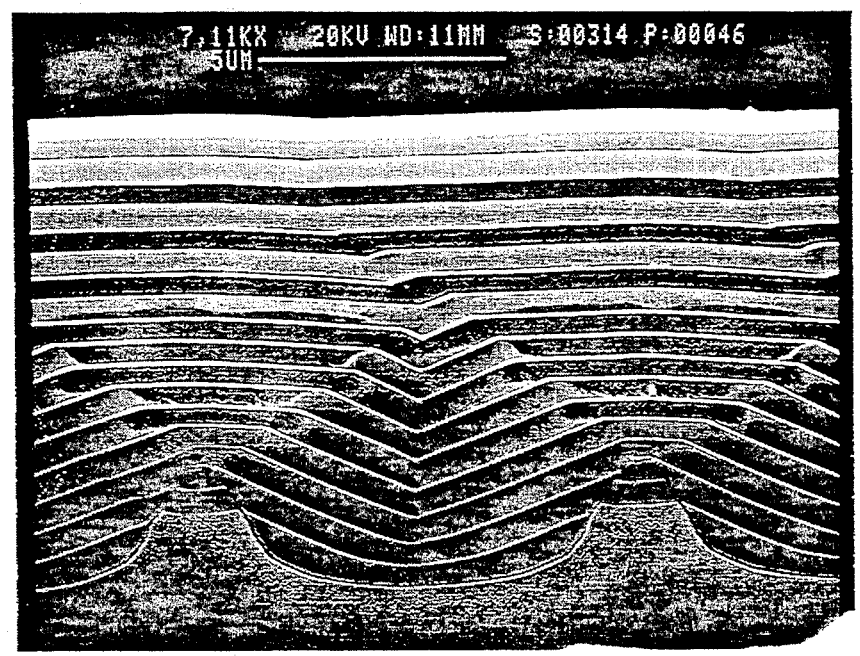
FIG. 6 is a micrograph of an SEM cross-section of the same structure in FIG. 5 on a substrate with ridges after stain-etching.

To better understand the mechanism of this invention for migration-enhanced dopant diffusion, a structure was grown consisting of eighteen Al$_{0.7}$Ga$_{0.3}$As layers, each 0.5 $\mu$m thick, separated by 500 Å GaAs marker layers. The AlGaAs layers were alternatively doped with Mg and Se to $\sim 10^{18}$ cm$^{-3}$; these values being determined previously by experimentally growing thick AlGaAs layers on (100) GaAs substrates. The epilayers were grown at 820° C. and a V/III ratio of 100 in a low pressure (50 Torr) MOCVD reactor. FOG. 5 shows an SEM micrograph cross-section of the structure on a (100) flat surface (no ridges) after stainetching in KOH:-KFe(CN)$_6$:H$_2$O solution. The p-type and n-type layers are clearly observable. Conversely, for a structure grown on a substrate having a plurality of ridges, FIG. 6 shows that extensive dopant diffusion into the adjacent layers has converted the p-type layers on the sidewalls of the ridges into n-type layers, and the n-type layers on the top of the ridges into p-type layers. The effect of dopant incorporation was separated from the dopant diffusion observed here by careful studies of thermal annealing of these layers in AsH$_3$. It is important to note that the interdiffusion of p-dopant into the n-doped regions on top of the ridges is not restricted to the close proximity of the ridge top, but extends several $\mu$m into the multilayer structure. Thus, index-guided lasers with efficient current blocking may be fabricated by single-step growth.

Since the structure of the surface is important in determining the final distribution of dopant atoms on the growing surfaces, the extent of lateral migration of dopant atoms may vary depending on the exact orientation of the slope of the sidewalls of the ridges. The effect of migration-enhanced dopant incorporation is found to be most significant on [011] ridges with sidewall slopes around (311), whereas it is suppressed for sidewalls slopes around (111). This is attributed to the fact that (311) facets provide the maximum number of surface steps, or preferential incorporation sites for dopant atoms to register. The preferential incorporation of dopants and the induced concentration gradient for dopant migration are thus optimized for slopes around (311). Complete type-conversion has been observed for n- and p-type layers as thick as 0.5 $\mu$m, doped to $\sim 10^{18}$ cm$^{-3}$, on [011] ridges joined by (311) sidewall slopes. It will also be readily understood that ridge orientations of [01 −1] and sidewall orientations of (31 −1) are equally suitable. For intermediate sidewall slopes, type-conversions can be accelerated by adjusting the relative doping levels and layer thicknesses in the n- and p-type layers. A brief anneal under arsine has also been proven to be effective in accelerating the diffusion of the dominant doping species into adjacent layers. Typical annealing conditions are 820° C., or near the growth temperature, for 30~60 min.

It has been determined by observing the growth habits of AlGaAs on nonplanar, etched GaAs substrates that, once the epitaxial growth is developed, (311) facets inherently dominate the geometry of the sidewalls. During the MOCVD process, the relative area of (311) sloped facets increases until the growth on these surfaces catches up with the layers growing on top of the ridges. Then it decreases progressively as the layers become fully planarized. Thus, the exact geometry of the ridges is of less significance in determining the extent of dopant migration. The only geometrical constraint is that the sum of the original ridge width and ridge spacing has to be kept within twice the dopant diffusion length, or ~40 $\mu$m, in order to assure complete type conversion. For most practical applications, however, ridge widths within the range of dopant migration lengths are sufficient to ensure complete type-conversion.

Figure 7:
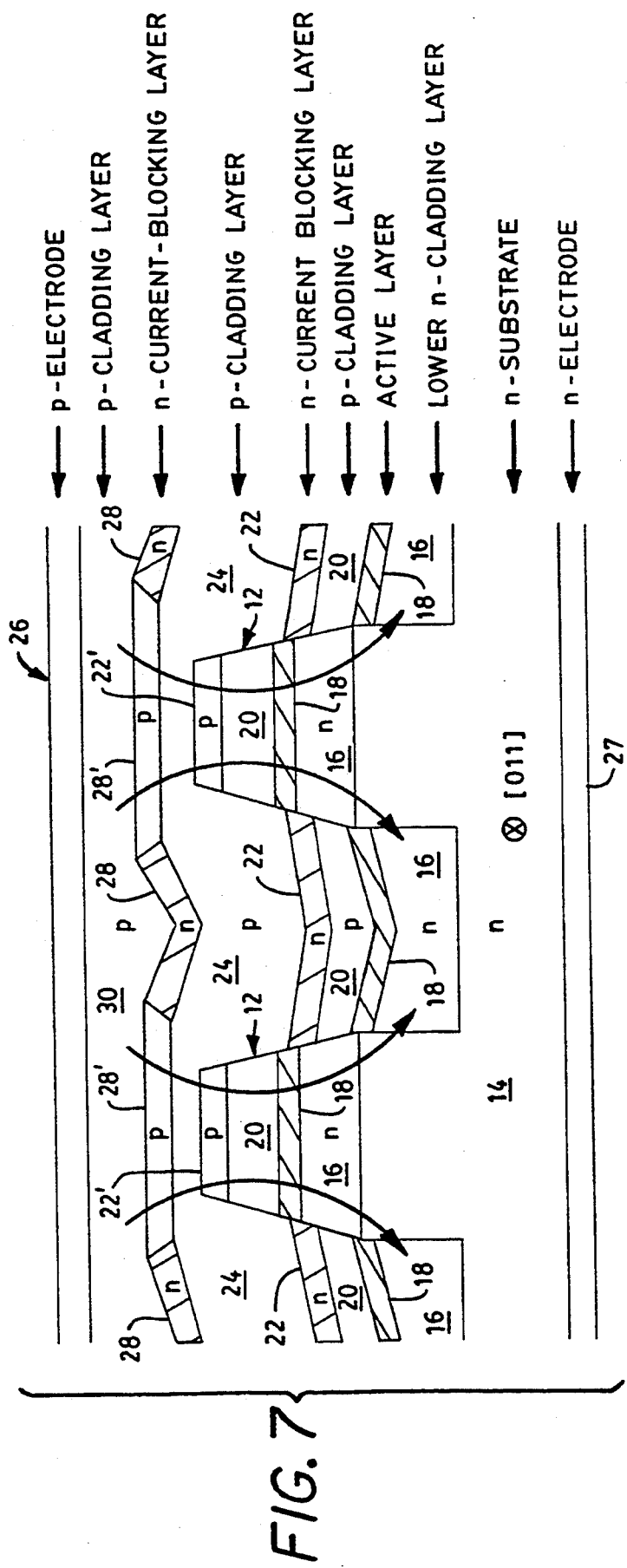
FIG. 7 is a cross-sectional view of an alternate embodiment of the laser array of FIG. 1 utilizing more than one blocking layer in the upper cladding layer.

Referring to FIG. 7 where like numerals designate previously described elements, there is shown an embodiment of this invention. Here, an additional current-blocking alternate layer 28 grown subsequent to the growth of the active layer is sandwiched between upper p-type cladding layer portions 24 and 30. It was observed that the portions of the n-type current-blocking layers 22, 28 as shown at 22', 28' grown on top of the ridges 12 are converted into p-type via dopant diffusion from the p-type cladding layers, thus forming an unimpeded path for the current. It is again important that the first current-blocking layer 22 is located below the active layer 18 on the ridge 12. This structure has the advantage of excellent lateral current confinement with lower leakage currents and more relaxed requirements for the position of the current-blocking layers 22, 28 with respect to the active layer 18.

Figure 8:
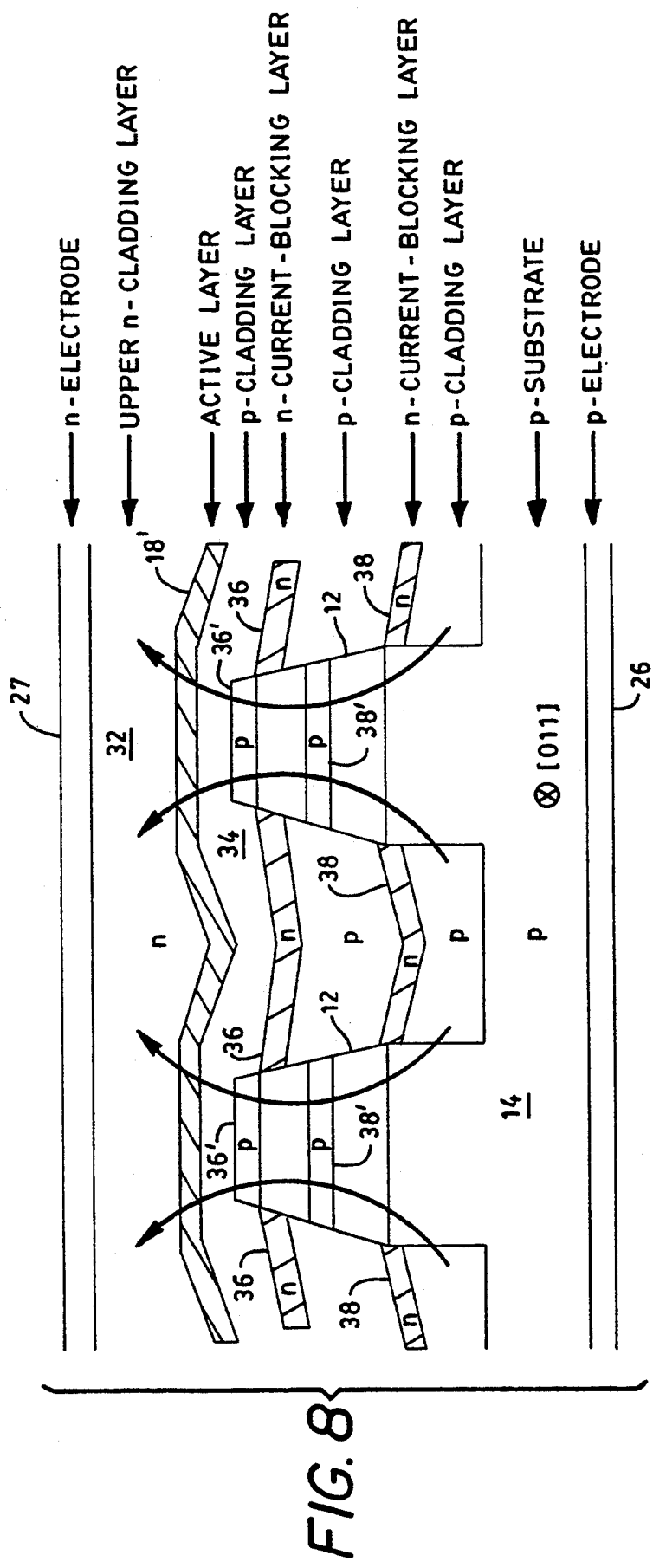
FIG. 8 is a cross-sectional view of another embodiment of the laser array of FIG. 1 with single or multiple current-blocking layers inserted in the lower cladding layer.

Another embodiment is shown in FIG. 8 where like numerals designate previously-described elements reverses the n- and p-type electrodes 26, 27. The active layer as shown at 18' is provided above the ridges 12 between an upper n-cladding layer 32 and a lower p-cladding layer 34. First and second current-blocking layers 36, 38 are provided in lower cladding layer 34, and each current-blocking layer has a respective p-type portion 36', 38' formed in each ridge 12 by the above-described migration enhanced dopant process to form unimpeded paths for the current.

Figure 9:
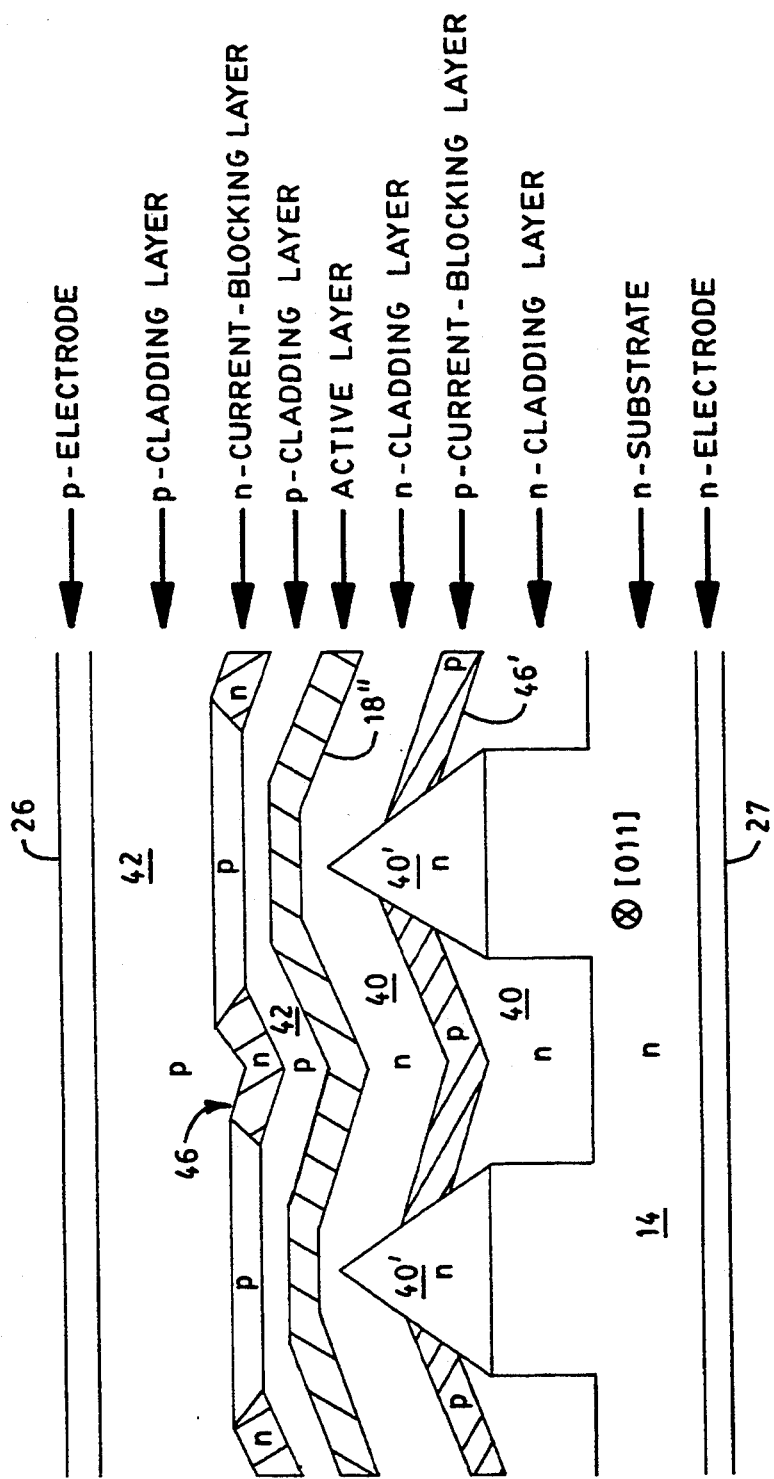
FIG. 9 is a cross-sectional view of still another embodiment of the laser array of FIG. 1 with current-blocking layers inserted in both the upper and the lower cladding layers.

Another embodiment as shown in FIG. 9 where like numerals designate previously-described elements provides an n-type current-blocking layer 46 above the active layer 18" in an upper cladding layer 42 and a p-type current-blocking layer 46' under the active layer 18" in a lower cladding layer 40. The lower cladding layer 40 includes portions 40' grown on top of each ridge. The portions 40' each converge to an apex at which point the growth stops. The p-type current blocking layer is thereafter grown over the intermediate portions of the cladding layer 40 between the portions 40' upon which no further growth occurs until the growth on the intermediate portions catches up. Since the current blocking layer 46' does not catch up to the apex of each portion 40', there will be defined a current path to each ridge.

It will be understood that the above-described laser structures can be of either the double heterostructure or quantum-well type depending upon the thickness of the active layer. Also, although laser arrays having two or more ridges have been described, it will be understood that a single ridge defining a single laser is also within the scope of the invention. It will be well understood that the invention is not limited to the specific III-IV semiconductor compounds disclosed and that other types of III-IV semiconductor compounds can be utilized.

Other embodiments of the invention, including additions, subtractions, deletions, and other modifications of the preferred disclosed embodiments of the invention will be obvious to those skilled in the art and are within the scope of the following claims.

What is claimed is:

1. A semiconductor laser comprising:
   a semiconductor substrate with at least one ridge etched on a first surface thereof;
   a first cladding layer of a first select conductivity type disposed in overlying contiguous relation with respect to the first surface of said semiconductor substrate;
   an active layer disposed in overlying contiguous relation with respect to said first cladding layer, said active layer being discontinuous from a portion of said active layer overlying said ridge to a portion of said active layer overlying a non-ridge area of said substrate;
   a second cladding layer of a second select conductivity type disposed in overlying contiguous relation with respect to said active layer, said second cladding layer having a dopant species therein such that the conductivity type of said second cladding layer is opposite to the conductivity type of said first cladding layer;
   at least one current blocking layer disposed in said second cladding layer and generally coextensive therewith, said blocking layer having a conductivity type opposite to the conductivity type of said second cladding layer except in that region overlying said ridge where the dopant species of said second cladding layer is sufficiently migrated therein to change the effective conductivity type to that of said second cladding layer thereby defining a current path through the second cladding layer to said ridge; and
   electrodes disposed on the outside surfaces of said substrate and second cladding layer.

2. The laser of claim 1 wherein at least one current blocking layer is located in the area adjacent the ridge spatially below the active layer in the ridge.

3. The laser of claim 2 wherein at least another current blocking layer is located spatially above the active layer in the ridge.

4. The laser of claim 1 wherein the substrate orientation is (100), the ridge orientation is [011] and the sidewall slope orientation of the ridge is (311).

5. The laser of claim 1 wherein the substrate orientation is (100), the ridge orientation is [01−1] and the sidewall slope orientation is (31−1).

6. The laser according to claim 4 or 5 in which said substrate is n-type, said first cladding layer is n-type doped, and said second cladding layer is p-type doped.

7. The laser according to claim 4 or 5 in which said substrate is p-type, said first cladding layer is p-type and said second cladding layer is n-type.

8. An index guided semiconductor laser comprising:
   a semiconductor substrate with at least one ridge etched on a first surface thereof;
   a first cladding layer of a first select conductivity type, said cladding layer having a dopant species therein and disposed in overlying contiguous relation with respect to the first surface of said semiconductor substrate; said first cladding layer extending spatially above said ridge;
   an active layer disposed in overlying contiguous relation with respect to said first cladding layer;
   a second cladding layer disposed in overlying contiguous relation with respect to said active layer;
   at least one current blocking layer disposed in said first cladding layer spatially below the top of said ridge, said blocking layer having a conductivity type opposite to the conductivity type of said first cladding layer except in the region of said ridge where the dopant species of said first cladding layer is sufficiently migrated therein to change the effective conductivity type to that of said first cladding layer thereby defining a current path through the first cladding layer via the ridge; and
   electrodes disposed on the outside surfaces of said substrate and said second cladding layer.

9. The laser of claim 8 wherein a first current blocking layer is located in the area adjacent the top of the ridge and at least one other current blocking layer is located below the first current blocking layer.

10. The laser of claim 8 wherein the substrate orientation is (100), the ridge orientation is [011], and the sidewall slope orientation of the ridge is (311).

11. The laser of claim 8 wherein the substrate orientation is (100), the ridge orientation is [01−1] and the sidewall slope orientation of the ridge is (31−1).

12. The laser according to claim 10 or 11 wherein the substrate is p-type, said first cladding layer is p-type, and said second cladding layer is n-type doped.

13. The laser according to claim 10 or 11 wherein the substrate is n-type, said first cladding layer is n-type and said second cladding layer is p-type.

14. An index guided semiconductor laser comprising:
a semiconductor substrate with at least one ridge etched on a first surface thereof;
a first cladding layer of a first select conductivity type disposed in overlying contiguous relation with respect to the first surface of said semiconductor substrate, said first cladding layer being grown to a sufficient thickness over said ridge so as to reach an apex;
an active layer disposed in overlying contiguous relation with respect to said first cladding layer;
a second cladding layer of a second select conductivity type disposed in overlying contiguous relation with respect to said active layer, said second cladding layer having a dopant species therein such that the conductivity type of said second cladding layer is opposite to the conductivity type of said first cladding layer;
at least one current blocking layer disposed in said second cladding layer and generally coextensive therewith, said blocking layer having a conductivity type opposite to the conductivity type of said second cladding layer except in the region overlying said ridge where the dopant species of said second cladding layer is sufficiently migrated therein to change the effective conductivity type to that of said second cladding layer thereby defining a current path through the second cladding layer to said ridge;
at least one other current blocking layer disposed in said first cladding layer spatially below the apex of said first cladding layer over said ridge, said other blocking layer having a conductivity type opposite to the conductivity type of said first cladding layer so as to define a current path through the first cladding layer apex via the ridge; and
electrodes disposed on the outside surfaces of said substrate and said second cladding layer.

15. The laser of claim 14 wherein the substrate orientation is (100), the ridge orientation is [011], and the sidewall slope orientation of the ridge is (311).

16. The laser of claim 14 wherein the substrate orientation is (100), the ridge orientation is [01−1], and the sidewall slope orientation is (31−1).

17. The laser according to claim 15 or 16 wherein said substrate is n-type, said first cladding layer is n-type, and said second cladding layer is p-type.

18. The laser according to claim 15 or 16 wherein said substrate is p-type, said first cladding layer is p-type and said second cladding layer is n-type.

19. The laser of claim 14 wherein said other current blocking layer is disposed in the area adjacent said at least one ridge.

20. In a process for fabricating index-guided lasers by patterning a semiconductor substrate of a first select conductivity to have a plurality of substantially parallel spaced apart ridges with sidewalls disposed on a first flat surface thereof, whereby facing sidewalls together with the flat surface form a flat-bottom groove lying between adjacent ridges;
growing a first cladding layer of the first conductivity type as the substrate over the first surface of the substrate;
growing an active layer in overlying relation with respect to said first cladding layer; and
growing a second cladding layer of opposite conductivity type to said first cladding layer in overlying relation with respect to said active layer, the improvement comprises:
growing at least one current blocking layer in overlying relation to a portion of at least one of said cladding layers, in a region sufficiently close to the ridges so as to effect a dopant migration from the adjacent cladding layer portion into the current blocking layer, said current blocking layers being doped to have a conductivity type opposite to the conductivity type of its adjacent cladding layer portion, said dopant migration in the vicinity of said ridges being sufficient to effectively change the conductivity type of said current blocking layer to the conductivity type of the adjacent cladding layer.

21. The process of claim 20 wherein the current blocking layer is grown in overlying relation to the active layer and atop the ridges where dopant migration from the cladding layer adjacent the ridges operates to change the conductivity type of the current blocking layer in the region immediately atop the ridges.

22. The process of claim 21 wherein the sum of the ridge width and spacing is less than twice the maximum dopant diffusion length.

* * * * *